United States Patent
Kong

(10) Patent No.: US 7,749,895 B2
(45) Date of Patent: Jul. 6, 2010

(54) CAPACITOR OF SEMICONDUCTOR DEVICE AND METHOD FOR FABRICATING THE SAME

(75) Inventor: Keun Kyu Kong, Icheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 334 days.

(21) Appl. No.: 11/819,856

(22) Filed: Jun. 29, 2007

(65) Prior Publication Data

US 2008/0200024 A1    Aug. 21, 2008

(30) Foreign Application Priority Data

Feb. 21, 2007    (KR)   ....................... 10-2007-0017505

(51) Int. Cl.
*H01L 21/4763*    (2006.01)

(52) U.S. Cl. ................ 438/636; 257/296; 257/E21.495

(58) Field of Classification Search ................. 438/636; 257/E21.495, 296

See application file for complete search history.

(56) References Cited

U.S. PATENT DOCUMENTS 6,972,262 B2 * 12/2005 Lee et al. .................... 438/706
7,018,933 B2 * 3/2006 Kim et al. ................... 438/710

FOREIGN PATENT DOCUMENTS

| KR | 20020086438 | * | 7/2004 |
| KR | 10-2005-0000896 A | | 1/2005 |
| KR | 10-2006-0018933 | | 3/2006 |
| KR | 10-2006-0059443 | | 6/2006 |

OTHER PUBLICATIONS

Korean Intellectual Property Office Notice of Rejection, Transmittal No. 9-5-2008-002223553, Transmittal date: Jan. 17, 2008, pp. 1-5.

* cited by examiner

*Primary Examiner*—W. David Coleman
*Assistant Examiner*—Sonya D McCall-Shepard
(74) *Attorney, Agent, or Firm*—IP & T Law Firm PLC

(57) ABSTRACT

A method for fabricating a semiconductor device includes forming an interlayer insulating film over a semiconductor substrate. The interlayer insulating film is selectively etched to form a hole defining a storage node region. A lower electrode is formed in the hole. A support layer is formed over the lower electrode. The support layer fills an upper part of the hole and exposes the interlayer insulating film. A dip-out process is performed to remove the interlayer insulating film. The supporting layer is removed to expose the lower electrode. A dielectric film is formed over the semiconductor substrate including the lower electrode. A plate electrode is formed over the semiconductor substrate to fill the dielectric film and the lower electrode.

12 Claims, 4 Drawing Sheets

CAPACITOR OF SEMICONDUCTOR DEVICE AND METHOD FOR FABRICATING THE SAME

CROSS-REFERENCES TO RELATED APPLICATIONS

The present application claims the benefit of priority to Korean patent application number 10-2007-0017505, filed on Feb. 21, 2007, the entire contents of which are incorporated herein by reference.

BACKGROUND

The invention relates to a memory device. More particularly, the invention relates to a semiconductor device having a capacitor and a method for fabricating the same.

In general, a Dynamic Random Access Memory ("DRAM") cell includes a capacitor for storing charges that represents information to be stored, and a transistor for controlling the charges stored in the capacitor. A transistor is formed over a semiconductor substrate. The transistor includes a gate electrode for controlling current flowing between source and drain regions. Charges stored in the capacitor are accessed through the transistor. The capacity of charge storage in the capacitor is called capacitance C. As the capacitance becomes larger, more information can be stored in the capacitor.

Capacitance C of the capacitor may be represented by the following equation 1.

$$C = \in A/d \qquad \text{Equation 1,}$$

where $\in$ represents a dielectric constant determined by the dielectric material disposed between two capacitor electrodes, d represents a distance between the two capacitor electrodes, and A represents an effective surface area of the two capacitor electrodes. According to Equation 1, capacitance C of the capacitor can be increased as dielectric constant $\in$ becomes larger, distance d becomes shorter, and/or effective surface area A becomes larger.

To increase capacitance C of the capacitor, one may consider increasing surface area A of the electrodes, decreasing the thickness of the dielectric material, and/or using a material having a larger dielectric constant. To increase effective area A of the electrodes, the electrodes of the capacitor may be changed to have a three dimensional structure, such as a concave structure and a cylinder structure.

A concave-structured capacitor includes a hole where an electrode of the capacitor is formed in an interlayer insulating layer. A lower electrode of the capacitor is formed within the hole. A dielectric film and an upper electrode are deposited over the lower electrode. Due to high-integration of semiconductor devices, it is difficult to secure a sufficient capacitance required in each cell of a limited cell area even by the concave-structured capacitor. As a result, a cylinder-structured capacitor has been produced for providing a surface area larger than the surface area of the concave-structured capacitor.

The cylinder-structured capacitor includes a hole where an electrode of the capacitor is formed in an interlayer insulating layer. A lower electrode of the capacitor is formed in the hole, and the interlayer insulating layer is removed. A dielectric film and an upper electrode are deposited over the residual lower electrode. The cylinder-structured capacitor can use the inner and outer surface of the lower electrode as an effective surface area, so as to have a capacitance larger than that of the concave-structured capacitor. A dip-out process is required when the cylinder-structured capacitor is formed.

The dip-out process is performed by a wet etching method involving a chemical solution. The chemical solution, however, causes leaning and collapse of the lower electrode. When the aspect ratio of the lower electrode for storage electrode is large due to high-integration of semiconductor devices, the leaning and collapse of the lower electrode degrade device performance.

SUMMARY

Embodiments consistent with the invention are directed to a semiconductor device having a capacitor. In one embodiment, the capacitor is fabricated through an improved dip-out process.

In one aspect, there is provided a method for fabricating a semiconductor device. The method comprises: forming an interlayer insulating film over a semiconductor substrate; selectively etching the interlayer insulating film to form a hole defining a storage node region; forming a lower electrode in the hole; forming a support layer over the lower electrode, the support layer filling an upper part of the hole and exposing the interlayer insulating film; performing a dip-out process to remove the interlayer insulating film; removing the support layer to expose the lower electrode; forming a dielectric film over the semiconductor substrate including the lower electrode; and forming a plate electrode over the dielectric film.

In another aspect, there is provided a semiconductor device manufactured according to the method described above.

DETAILED DESCRIPTION

The present invention relates to a semiconductor device having a capacitor. In one embodiment, the capacitor is formed using a support layer to prevent leaning and collapse of a lower electrode in a dip-out process.

Figure 1A:
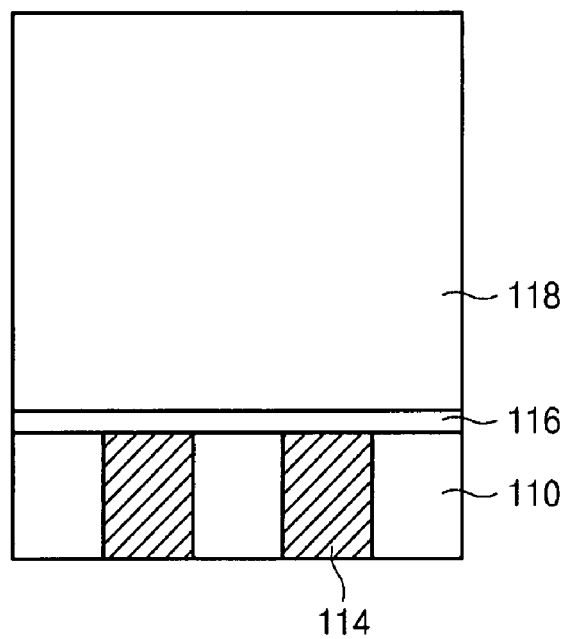
FIGS. 1a through 1h are cross-sectional views illustrating a method for fabricating a semiconductor device according to one embodiment consistent with the present invention.

FIGS. 1a through 1h are cross-sectional views illustrating a method for fabricating a semiconductor device according to one embodiment consistent with the present invention. A first interlayer insulating layer 110 may be formed over a lower structure (not shown), such as a semiconductor substrate, a word line, and/or a bit line. As shown in FIG. 1a, a storage node contact plug 114 is formed in first interlayer insulating layer 110. An etch stop layer 116 and a second interlayer insulating layer 118 are formed over first interlayer insulating layer 110 and storage node contact plug 114.

In one embodiment, etch stop layer 116 may include a nitride film, and second interlayer insulating layer 118 may include an oxide film. Also, second interlayer insulating layer 118 may be selected from the group consisting of a Phospho-Silicate-Glass ("PSG") oxide film, a Tetra-Ethyl-Ortho-Silicate ("TEOS") oxide film, and a combination thereof.

Figure 1B:
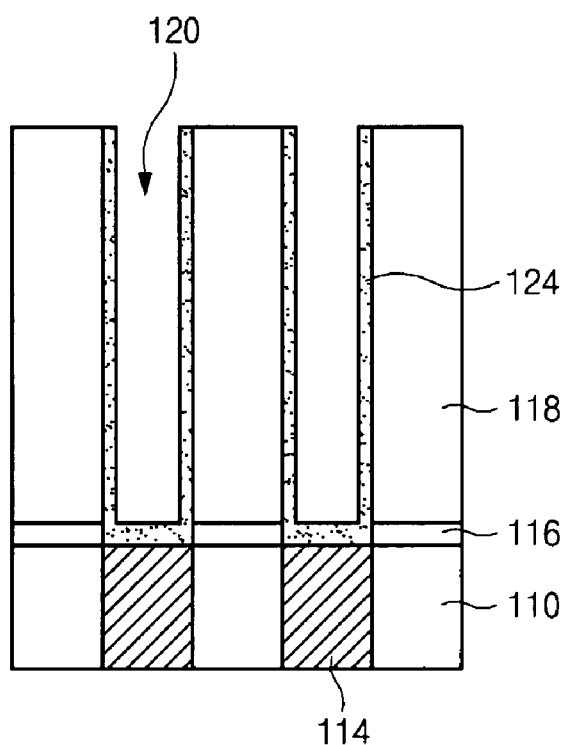

Referring to FIG. 1b, a photoresist pattern (not shown) that defines a lower electrode region 120 for storage nodes may be formed over second interlayer insulating layer 118. Second interlayer insulating layer 118 may be selectively etched using the photoresist pattern as a mask to form lower electrode region 120 for storage nodes. The photoresist pattern is then removed. A conductive layer (not shown) may be formed over the semiconductor substrate including lower electrode region 120. The conductive layer is blanket-etched until second interlayer insulating layer 118 is exposed, thereby forming a lower electrode 124. Lower electrode 124 is separated from other lower electrodes disposed in adjacent lower electrode regions.

In one embodiment, the conductive layer may include a TiN film. The process of blanket-etching the conductive layer may be performed by a Chemical Mechanical Polishing ("CMP") method and/or an etch-back method.

Figure 1C:
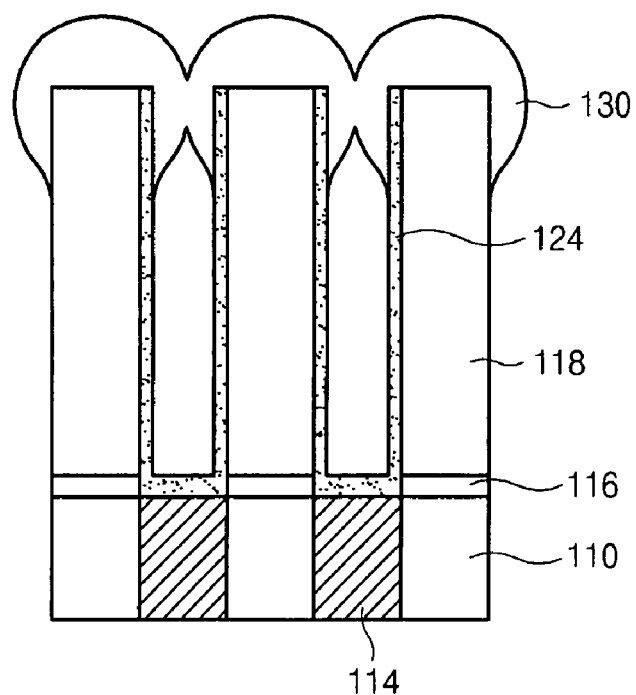
Figure 1D:
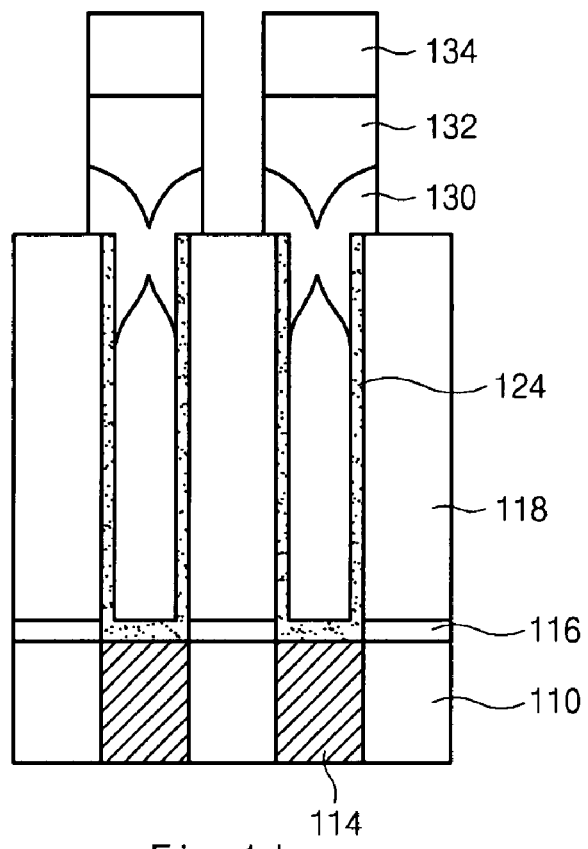
Figure 1E:
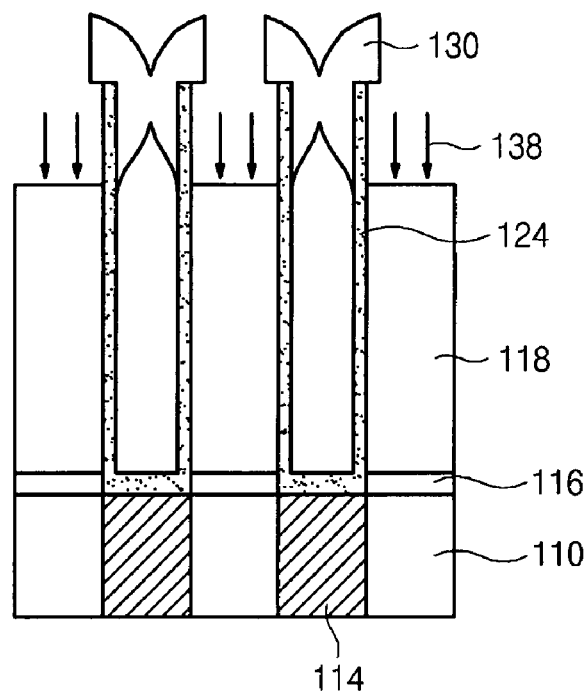
Figure 1F:
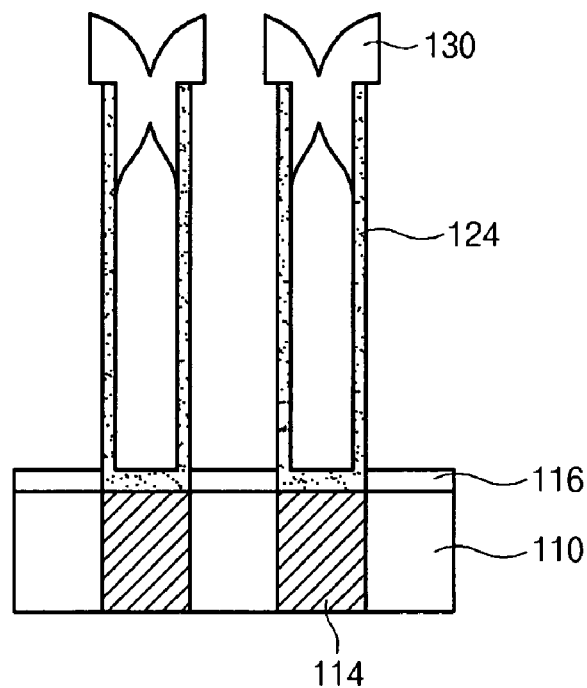
Figure 1G:
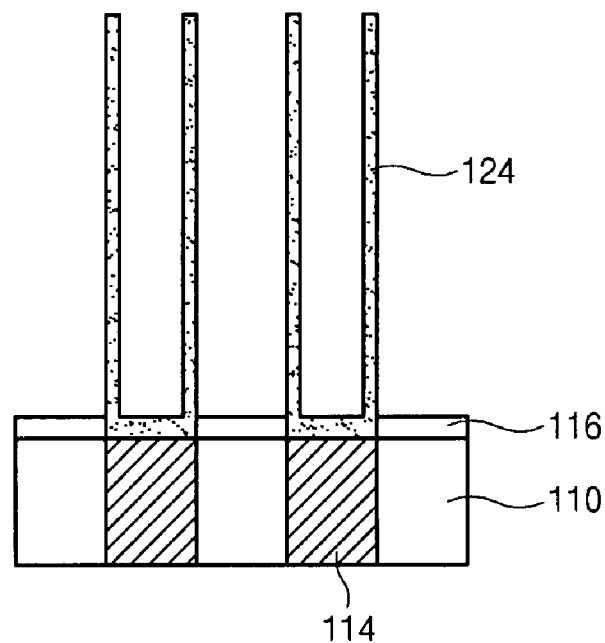
Figure 1H:
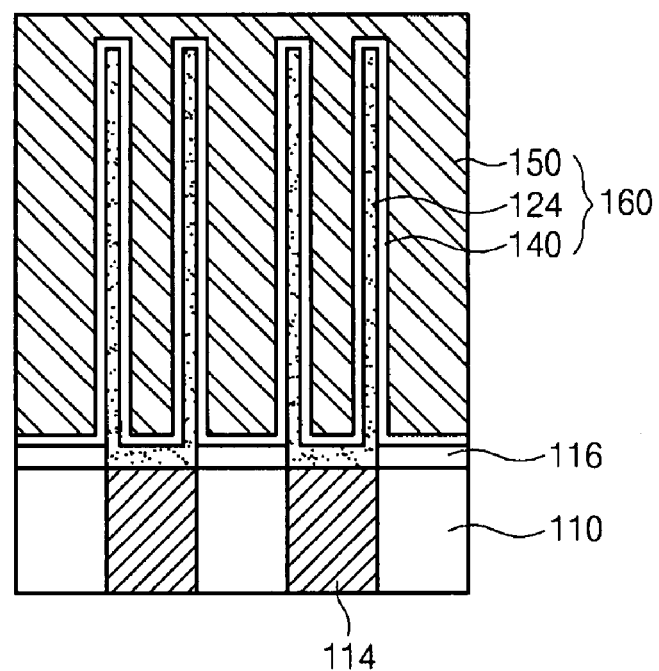

Referring to FIGS. 1c and 1d, a support layer 130 for preventing leaning and collapse of lower electrode 124 is formed over the semiconductor substrate. A bottom anti-reflection coating 132 is formed over support layer 130. A photoresist pattern 134 that covers lower electrode region 120 is formed over bottom anti-reflection coating 132. Bottom anti-reflection coating 132 and support layer 130 are selectively etched using photoresist pattern 134 as a mask to expose second interlayer insulating layer 118.

In one embodiment, support layer 130 for preventing leaning and collapse of lower electrode 124 may include an amorphous carbon film (now shown). The amorphous carbon film is deposited over a portion of second interlayer insulating layer 118 which defines lower electrode region 120 due to a poor step coverage property. The amorphous carbon film is not deposited on the lower part of second interlayer insulating layer 118 due to the narrow width of lower electrode region 120. The thickness of support layer 130 is in a range of about 50 nm to 1000 nm. The thickness of bottom anti-reflection coating 132 is in a range of about 20 nm to 50 nm. The thickness of photoresist pattern 134 is in a range of about 100 nm to 400 nm.

In another embodiment, photoresist pattern 134 can be formed using an additional mask that exposes a portion of second interlayer insulating layer 118 or a storage node mask. A light source of the exposing process may be selected from the group consisting of ArF, EUV, E-beam, x-ray, and ion-beam.

Referring to FIGS. 1e to 1h, photoresist pattern 134 and bottom anti-reflection coating 132 are removed. A dip-out process is performed using support layer 130 as a mask to remove second interlayer insulating layer 118. Support layer 130 can prevent leaning and collapse of lower electrode 124 in the dip-out process. In one embodiment, the dip-out process may be performed by a wet method using a chemical material.

Support layer 130 is then removed. In one embodiment, support layer 130 may be removed by a dry method. A dielectric film 140 is formed over the semiconductor substrate including lower electrode 124. Dielectric film 140 and lower electrode 124 are filled with an upper electrode 150 used as a plate electrode, to form a storage electrode.

Dielectric film 140 may be selected from the group consisting of a $TiO_2$ film, a $ZrO_2$ film, an $HfO_2$ film, an $Al_2O_3$ film, and combinations thereof. Upper electrode 150 may be selected from the group consisting of a TiN film, a Ru film and combinations thereof.

Although a capacitor having a cylindrical storage node has been exemplified in various embodiments consistent with the present invention, the shape of the capacitor is not limited thereto.

As described above, the present invention may prevent leaning and collapse of lower electrodes in a semiconductor device by using a chemical solution in a dip-out process to expose the lower electrode, thereby improving the electrical properties of the device and increasing the production yield of the device.

The above embodiments consistent with the present invention are illustrative and not limitative. Various alternatives and equivalents are possible. The invention is not limited by the types of deposition, etching, polishing, and patterning steps described herein. Nor is the invention limited to any specific types of semiconductor device. For example, the present invention may be implemented in a dynamic random access memory (DRAM) device or in a non-volatile memory device. Other additions, subtractions, or modifications are obvious in view of the present disclosure and are intended to fall within the scope of the appended claims.

What is claimed is:

1. A method for fabricating a semiconductor device, the method comprising:
   forming an interlayer insulating film over a semiconductor substrate;
   selectively etching the interlayer insulating film to form a hole defining a storage node region;
   forming a lower electrode in the hole;
   forming a support layer over the lower electrode, the support layer filling an upper part of the hole and exposing the interlayer insulating film, wherein the support layer comprises an amorphous carbon film;
   performing a dip-out process to remove the interlayer insulating film;
   removing the support layer to expose the lower electrode;
   forming a dielectric film over the semiconductor substrate including the lower electrode; and
   forming a plate electrode over the dielectric film.

2. The method of claim 1, further comprising forming an etch stop layer between the interlayer insulating layer and the semiconductor substrate.

3. The method of claim 1, wherein forming the lower electrode comprises:
   forming a conductive layer over the semiconductor substrate including the hole; and
   blanket-etching the conductive layer until the interlayer insulating film is exposed.

4. The method of claim 1, wherein a thickness of the support layer is in a range of about 50 nm to 1,000 nm.

5. The method of claim 1, wherein forming the support layer comprises:
   forming a supporting layer over the semiconductor substrate including the lower electrode;
   forming a photoresist film over the supporting layer;
   exposing and developing the photoresist film by using an exposure mask to form a photoresist pattern defining the interlayer insulating film disposed between the lower electrodes;
   etching the supporting layer by using the photoresist pattern as an etching mask to expose the interlayer insulating film; and
   removing the photoresist pattern.

6. The method of claim 1, wherein the lower electrode comprises a titanium nitride ("TiN") film.

7. The method of claim 3, wherein blanket-etching the conductive layer comprises performing a Chemical Mechanical polishing ("CMP") method or an etch-back method.

8. The method of claim 5, further comprising forming a bottom anti-reflective coating between the photoresist film and the supporting layer.

9. The method of claim 5, wherein a thickness of the photoresist film is in a range of about 100 nm to 400 nm.

10. The method of claim 5, wherein the exposure mask is a storage node mask or a mask exposing a portion of the interlayer insulating film between the lower electrodes.

11. The method of claim 5, wherein a light source of the exposing process is selected from the group consisting of ArF, EUV, E-beam, x-ray, and ion-beam.

12. The method of claim 8, wherein a thickness of the bottom anti-reflective coating is in a range of about 20 nm to 50 nm.

* * * * *